(12) United States Patent
Langguth et al.

(10) Patent No.: US 11,967,639 B2
(45) Date of Patent: Apr. 23, 2024

(54) SCR STRUCTURE FOR ESD PROTECTION IN SOI TECHNOLOGIES

(71) Applicant: Infineon Technologies AG, Neubiberg (DE)

(72) Inventors: Gernot Langguth, Oberhaching (DE); Anton Boehm, Munich (DE); Christian Cornelius Russ, Diedorf (DE); Mirko Scholz, Ottobrunn (DE)

(73) Assignee: Infineon Technologies AG, Neubiberg (DE)

( * ) Notice: Subject to any disclaimer, the term of this patent is extended or adjusted under 35 U.S.C. 154(b) by 150 days.

(21) Appl. No.: 17/648,985

(22) Filed: Jan. 26, 2022

(65) Prior Publication Data

US 2023/0238454 A1    Jul. 27, 2023

(51) Int. Cl.
*H01L 29/74* (2006.01)
*H01L 27/02* (2006.01)
(Continued)

(52) U.S. Cl.
CPC ...... *H01L 29/7436* (2013.01); *H01L 27/0259* (2013.01); *H01L 29/0692* (2013.01);
(Continued)

(58) Field of Classification Search
CPC ............. H01L 29/7436; H01L 27/0259; H01L 29/0692; H01L 27/0285; H01L 27/0292; H01L 29/7408; H02H 9/046
See application file for complete search history.

(56) References Cited

U.S. PATENT DOCUMENTS

| | | | |
|---|---|---|---|
| 5,982,600 A | * | 11/1999 | Cheng ................... H01L 27/092 361/111 |
| 2002/0053704 A1 | * | 5/2002 | Avery ................. H01L 27/0255 257/361 |

(Continued)

OTHER PUBLICATIONS

Huang, Xiaozong et al., "The Segmented SCRs with Optimized Holding Voltage for On-Chip ESD Protection", IEEE 24th International Symposium on the Physical and Failure Analysis of Integrated Circuits (IPFA), Jul. 4-7, 2017, 4 pages.

(Continued)

*Primary Examiner* — Michael P McFadden
(74) *Attorney, Agent, or Firm* — Slater Matsil, LLP

(57) ABSTRACT

In accordance with an embodiment, a semiconductor device includes: an n-doped region disposed over an insulating layer; a p-doped region disposed over the insulating layer adjacent to the n-doped region, where an interface between the n-doped region and the p-doped region form a first diode junction; a plurality of segmented p-type anode regions disposed over the insulating layer, each of the plurality of segmented p-type anode regions being surrounded by the n-doped region, where a doping concentration of the plurality of segmented p-type anode regions is greater than a doping concentration of the p-doped region; and a plurality of segmented n-type cathode regions disposed over the insulating layer. Each of the plurality of segmented n-type cathode regions are surrounded by the p-doped region, (Continued)

where a doping concentration of the plurality of segmented n-type cathode regions is greater than a doping concentration of the n-doped region.

20 Claims, 13 Drawing Sheets

(51) Int. Cl.
  *H01L 29/06* (2006.01)
  *H02H 9/04* (2006.01)
(52) U.S. Cl.
  CPC ......... *H02H 9/046* (2013.01); *H01L 27/0285* (2013.01); *H01L 27/0292* (2013.01); *H01L 29/7408* (2013.01)

(56) References Cited

U.S. PATENT DOCUMENTS

| | | | | |
|---|---|---|---|---|
| 2003/0047750 A1* | 3/2003 | Russ | ............ | H01L 29/7436 |
| | | | | 257/E29.085 |
| 2004/0124435 A1* | 7/2004 | D'Evelyn | ............ | H01L 21/0254 |
| | | | | 257/E29.189 |
| 2004/0256690 A1* | 12/2004 | Kocon | ............ | H01L 29/407 |
| | | | | 257/E29.256 |
| 2005/0195540 A1* | 9/2005 | Streibl | ............ | H01L 27/0262 |
| | | | | 361/100 |
| 2011/0147794 A1* | 6/2011 | Gauthier, Jr. | ....... | H01L 27/0259 |
| | | | | 257/E29.225 |
| 2012/0178222 A1* | 7/2012 | Abou-Khalil | ............ | G06F 30/30 |
| | | | | 716/101 |
| 2013/0056731 A1* | 3/2013 | Mauder | ............ | H01L 29/36 |
| | | | | 257/E29.198 |
| 2017/0323912 A1* | 11/2017 | Lahav | ............ | H01L 27/14609 |
| 2018/0061823 A1* | 3/2018 | Weyers | ............ | H01L 29/1095 |
| 2018/0301537 A1* | 10/2018 | Weyers | ............ | H01L 29/1608 |

OTHER PUBLICATIONS

Huang, Xiaozong et al., "High holding voltage SCRs with segmented layout for high-robust ESD protection", Electronics Letters, vol. 53, No. 18, Aug. 31, 2017, pp. 1274-1275.

Keppens, Bart et al., "Concept for Body Coupling in SOI MOS Transistors to Improve Multi-Finger Triggering", Electrical Overstress/ Electrostatic Discharge Symposium, Sep. 10-15, 2006, 7 pages.

Li, Junjun et al., "Investigation of SOI SCR Triggering and Current Sustaining under DC and TLP Conditions", IBM Semiconductor Research and Development Center, US, 35th Electrical Overstress/ Electrostatic Discharge Symposium, Sep. 10-12, 2013, 6 pages.

Li, You et al., "Junction Engineering for SOI SCR Triggering and Performance Improvement", Electrical Overstress/Electrostatic Discharge Symposium Proceedings, Sep. 7-12, 2014, 8 pages.

Lin, Lin et al., "Design Optimization of a Breakdown Silicon Controlled Rectifier (BDSCR) for Cell Phone Antenna Switch Pin Electrostatic Discharge (ESD) Protection", 40th Electrical Overstress/ Electrostatic Discharge Symposium (EOS/ESD), Sep. 23-28, 2018, 8 pages.

Marichal, Olivier et al., "SCR based ESD protection in nanometer SOI technologies", Electrical Overstress/ Electrostatic Discharge Symposium, US, Sep. 8-16, 2005, 8 pages.

* cited by examiner

US 11,967,639 B2

SCR STRUCTURE FOR ESD PROTECTION IN SOI TECHNOLOGIES

TECHNICAL FIELD

The present invention relates generally to a silicon-controlled rectifier (SCR) structure for ESD protection in silicon on insulator (SOI) technologies.

BACKGROUND

Silicon controlled rectifiers (SCRs), also known as thyristors, are widely used ESD protection devices. The high current capability per parasitic capacitance of SCRs makes them particularly useful for the protection of pins requiring relatively low capacitance, such as pins designated for radio frequency (RF) signals.

The structure of an SCR can be represented as a npn bipolar transistor interconnected with a pnp bipolar transistor such that the base region of the npn transistor forms the collector region of the pnp transistor and vice versa. In bulk CMOS technology, an SCR is often constructed using a lateral p/n/p/n structure formed using a combination of lightly doped n-well and p-well regions that serve as "trigger" regions and heavier doped p-type and n-type diffusion regions disposed within the p-well and p-well regions that respectively serve as the anode and cathode of the SCR.

In general, SCRs constructed in bulk CMOS technology are triggered when an applied anode-cathode voltage exceeds the reverse breakdown of a junction at the interface between a lightly doped n-well region and a lightly doped p-well region. The physical geometry of the lightly doped n-well and p-well regions make them well suited for efficient triggering due to their relative physical depth, in that paths for triggering current exist underneath highly doped anode and cathode regions of the SCR.

While bulk CMOS technology is used for many IC applications, silicon on insulator (SOI) technologies are often used for applications such high performance analog or radio frequency (RF) circuits that require very low input capacitances, or for low power applications that require low leakage current. However, in SOI device technologies where the silicon film forming doped diffusion regions has a similar thickness as the shallow trench isolation (STI), SCRs formed in such SOI technologies have lightly doped p-well and n-well regions that are strictly laterally disposed adjacent to the highly doped anode and cathode region. As such, SCRs formed in SOI technologies lack the easily accessible triggering path underneath the anode and cathode regions. This presents challenges in designing high performance, size efficient ESD SCRs.

SUMMARY

In accordance with an embodiment, a semiconductor device includes: an n-doped region disposed over an insulating layer; a p-doped region disposed over the insulating layer adjacent to the n-doped region, where an interface between the n-doped region and the p-doped region form a first diode junction; a plurality of segmented p-type anode regions disposed over the insulating layer, each of the plurality of segmented p-type anode regions being surrounded by the n-doped region, where a doping concentration of the plurality of segmented p-type anode regions is greater than a doping concentration of the p-doped region; and a plurality of segmented n-type cathode regions disposed over the insulating layer. Each of the plurality of segmented n-type cathode regions are surrounded by the p-doped region, where a doping concentration of the plurality of segmented n-type cathode regions is greater than a doping concentration of the n-doped region.

In accordance with another embodiment, an ESD protection circuit includes: at least one silicon controlled rectifier (SCR) device including: an n-well region disposed over an insulating layer and coupled to a first trigger node via an n-doped tap region disposed adjacent to the n-well region, a p-well region disposed over the insulating layer adjacent to the n-well region and coupled to a second trigger node via a p-doped tap region adjacent to the p-well region, where the n-well region and p-well region form a first diode, segmented p-type anode regions disposed over the insulating layer and connected to an anode node, each of the segmented p-type anode regions being surrounded by the n-well region, and segmented n-type cathode regions disposed over the insulating layer and connected to a cathode node, each of the segmented n-type cathode regions being surrounded by the p-well region; and a trigger device coupled to the at least one SCR.

In accordance with a further embodiment, a method of ESD protection using a silicon controlled rectifier (SCR) including an n-doped region disposed over an insulating layer and coupled to a first trigger node via an n-doped tap region disposed adjacent to the n-doped region, a p-doped region disposed over the insulating layer adjacent to the n-doped region and coupled to a second trigger node via a p-doped tap region adjacent to the p-doped region, where the n-doped region and p-doped region form a first diode, segmented p-type anode regions disposed over the insulating layer and connected to an anode node, each of the segmented p-type anode regions being surrounded by the n-doped region, and segmented n-type cathode regions disposed over the insulating layer and connected to a cathode node, each of the segmented n-type cathode regions being surrounded by the p-doped region includes: detecting an ESD pulse using a trigger device; activating the SCR via the trigger device upon detection of the ESD pulse; and conducting an ESD current via the SCR.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In an embodiment, an SCR constructed in a SOI process includes segmented p-type anode regions disposed in an n-doped region, and segmented n-type cathode regions disposed in a p-doped region. An interface between the n-doped region and the p-doped region form a diode junction. By segmenting the p-type anode regions and n-type cathode regions, homogeneous access can be advantageously provided along the width of the SCR device with minimum loss of active SCR area, since the p-type anode and n-type cathode regions may be only interrupted by narrow regions to get access to the n-doped region and the p-doped regions in various embodiments. Moreover, homogeneous built-in diodes between the segmented p-type anode regions and the n-doped region, and between the segmented n-type cathode regions and the p-doped regions advantageously have the same or similar ESD hardness as the SCR, and are therefore well suited for use in embodiments directed to transient triggered SCRs (TTSCRs) for input-output (I/O) pins. Some embodiments, allow for SCR devices to be implemented with small spacings between its subcomponents, which advantageously allows for an embodiment SCR to be implemented in a small area while at the same ensuring a low base resistance from each tap region of the SCR to its respective p-type doped region or n-type doped region. This low base resistance between various regions of the SCR device also advantageously allows for very fast triggering for transient triggered SCR (TI-SCR) applications.

Figure 1A:
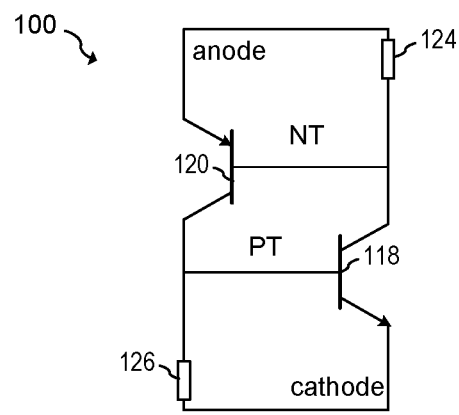
FIG. 1A illustrates a schematic of an exemplary SCR device.

FIG. 1A illustrates a schematic of an exemplary SCR device 100. As shown, SCR device 100 is represented as including bipolar pnp transistor 120, bipolar npn transistor 118, resistor 124, and resistor 126. The emitter of pnp transistor 120 serves as the "anode" node, the emitter of npn transistor 118 serves as the "cathode" node, the base of npn transistor 118 and collector of pnp transistor 120 serve as the p-type trigger node PT, and the base of pnp transistor 120 and collector of npn transistor 118 serve as the n-type trigger node NT of SCR 100. Resistor 124 represents a parasitic or externally added resistance between the anode node and the n-type trigger node NT, and resistor 128 represents a parasitic or externally added resistance between the cathode node and the p-type trigger node PT. It should be understood however, that the construction of the SCR is physically formed by four semiconductor regions, namely p-type, n-type, p-type and n-type disposed adjacent to each other as will be explained below.

Assuming the SCR is initially in an off-state, which means that pnp transistor 120 and npn transistor 118 do not conduct current and the device has a very high resistance, the SCR can be turned on by applying a positive voltage between anode and cathode initiated by an avalanche breakdown of the junction between n-type trigger node NT and p-type trigger node PT or schematically represented as the base-collector junctions of pnp transistor 120 and npn transistor 118. Once this breakdown occurs, pnp transistor 120 and npn transistor 118 are turned on and the SCR is driven into a "latched" state. The voltage at which the SCR turns on can be referred to as a "trigger voltage." During operation, when npn transistor 118 is turned on, n-type trigger node NT is pulled to the voltage potential of the cathode, which keeps pnp transistor 120 turned on. Similarly, when pnp transistor 120 is turned on, p-type trigger node PT is pulled to the voltage potential of the anode, which keeps npn transistor 118 turned on. Once the SCR is turned on, the SCR may remain on in even if the applied voltage between the anode and the cathode falls below the trigger voltage.

Figure 1B:
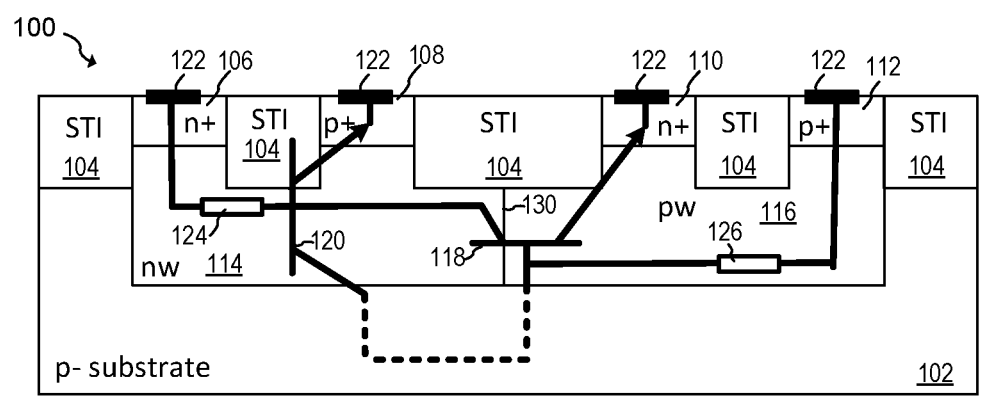
FIG. 1B illustrates a cross-section view of the exemplary SCR device of FIG. 1A.

FIG. 1B illustrates a cross section of a SCR device 100 fabricated in a bulk CMOS process. As shown, SCR 100 is formed by an n-well region 114 disposed adjacent to a p-well region 116. A highly doped p-type anode region 108 is disposed in a lightly doped n-well region 114, and a highly doped n-type cathode region 110 is formed in a lightly doped p-well region 116. The n-well region 114 is connected via a highly doped n-type diffusion region 106, and p-well region 116 is connected via a highly doped p-type diffusion region 112. Generally, n-type cathode region 110 and n-type region 106 have a higher doping concentration than n-well region 114, and p-type anode region and p-type region 112 have a higher doping concentration than p-well region 116. Contact to n-type cathode region 110, n-type region 106, n-type anode region, p-type region 112 is made via contacts 122, which may be formed by silicide regions.

As is further shown, n-well region 114 and p-well region 116 are disposed over a lightly doped p-type substrate 102. Shallow trench isolation (STI) regions 104 are disposed between n-type region 106 and highly doped p-type anode region 108, between highly doped p-type anode region 108 and highly doped n-type cathode region 110, and between highly doped n-type cathode region 110 and p-type region 112. STI regions 104 are also disposed at the perimeter of SCR 100 in order to isolate SCR 100 from other devices.

For the purpose of illustration, FIG. 1B is annotated to show the representative devices of the schematic of FIG. 1A superimposed over the semiconductor cross section. Thus, it can be seen what n-well region 114 forms the base of pnp transistor 120 and the collector of npn transistor 118, and p-well region 116 and/or substrate 102 form the base of npn transistor 118 and the collector of pnp transistor 120. The p-type anode region 108 forms the emitter of pnp transistor 120, as well as the anode of the SCR, and the n-type cathode region 110 form the emitter of npn transistor 118. The parasitic resistance of n-well region 114 is represented by resistor 124, and the parasitic resistance of p-well region 116 is represented by resistor 126. The interface 130 between n-well region 114 and p-well region 116 forms a diode junction.

It can be seen that an uninterrupted access to the junction between n-well-region 114 and p-well region 116 exists because n-well region 114 and p-well region 116 are respectively deeper than the relatively shallower p-type anode region 108 and n-type cathode regions 110. Thus, a relatively low-impedance paths can be formed between n-type region 106 and interface 130, and between p-type region 112 and interface 130. However, in SOI device technologies where the silicon film forming doped diffusion regions has a similar thickness as the shallow trench isolation (STI) and the well regions, there is no current path for triggering current underneath the anode and cathode regions of the SCR. Thus, in some cases, implementing SCRs in thin film SOI technology involves interrupting the anode and cathode with diffusion regions with other doped diffusion regions that contact the lighter doped n-type and p-type regions forming the base of the bipolar transistors of the SCR and/or increasing the distance between these doped diffusion regions and the diode junction between the lighted doped n-type and p-type regions. This effectively increases the physical size of the SCR and reduces the current gain of the bipolar transistors that form the SCR.

Figure 2A:
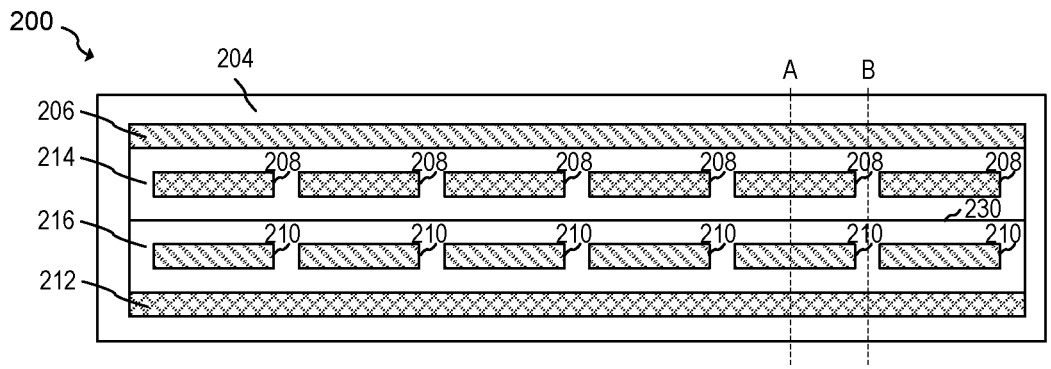
FIG. 2A illustrates a plan view of a layout of an embodiment SCR device.

FIGS. 2A-2D illustrates an SCR 200 implemented using a thin-film SOI semiconductor technology. FIG. 2A is a plan view of a layout of SCR 200. As shown, SCR 200 includes a lightly doped p-type region 214, (also referred to as a "p-doped region"), a lightly doped n-doped region 216 (also referred to as an "n-doped region"), heavier doped n-type regions 208 (also referred to as "cathode regions"), and heavier doped p-type regions 210 (also referred to as "anode regions"). Electrical connection to p-doped region 214 is made via a heavier doped p-type region 206 (also referred to as a "p-tap region"), and electrical connection to n-doped region 212 is made via a heaver doped n-type region 212 (also referred to as an "n-tap region").

As shown n-type cathode regions 208 are disposed within p-doped region 214 and spaced apart from each other. Similarly, p-type anode regions 210 are disposed within n-doped region 216 and spaced apart from each other. The interface 230 between p-doped region 214 and n-doped region 216 forms a diode junction. Segmenting n-type cathode regions 208 apart from each other create short, conductive paths coupled between p-doped tap region 206 and interface 230 in between segmented n-type cathode regions 208. Similarly, Segmenting p-type anode regions 210 apart from each other, short, conductive paths coupled to n-doped tap region 212 and interface 230 in between p-type anode regions 210. As is apparent from FIGS. 2A and 2B, each of the segmented p-type cathode anode regions 210 are laterally surrounded by n-doped region 216, and each of the segmented n-type cathode regions 208 are laterally surrounded by p-doped region 214. Each of these segmented regions may be completely laterally surrounded, or alternatively may be partially laterally surrounded. In various embodiments segmented n-type cathode regions 208 and/or p-type anode regions 210 are disposed parallel to interface 230, e.g., the segmented n-type cathode regions 208 are arranged in a first line parallel to the interface 230 and/or the segmented p-type anode regions 210 are arranged in a second line parallel to the interface 230. Additionally or alternatively, n-type cathode regions 208 may be disposed parallel to p-doped tap region 206 and/or p-type anode regions 210 may be disposed parallel to n-doped tap region 212. Contacts to p-doped tap regions 206, n-type cathode regions 208, p-type anode regions 210 and n-doped tap regions 212 are made via contact regions 122.

Figure 2B:
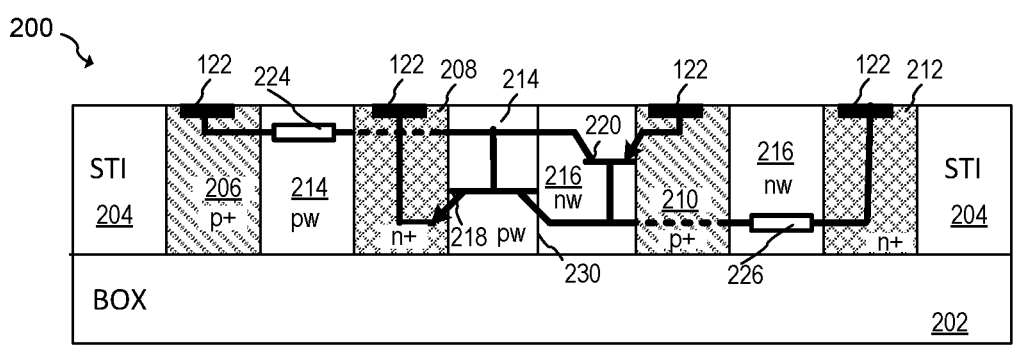
FIGS. 2B and 2C are cross-sectional views of the embodiment SCR device.

FIG. 2B illustrates a cross-section of the SCR device of FIG. 2A taken at line "A." As shown, p-doped tap region, 206, p-doped region 214, n-type cathode region 208, n-doped region 216, p-type anode region 210 and n-doped tap region 212 are all disposed over an insulating layer 202. In some embodiments, insulating layer 202 may be a buried oxide (BOX) layer. Shallow trench isolation (STI) 204 is disposed over insulating layer 202 adjacent to p-type tap region 206 and n-doped tap region 212. However, it should be understood that STI 204 may surround the entire SCR device 200 in order to isolate SCR device 200 from other devices in the same silicon film.

In various embodiments, insulating layer 202 is formed on a substrate (not shown), such as a p-type silicon substrate or other substrate type. For example, insulating layer 202 may be a BOX layer formed, for example, by implanting oxygen via an ion-beam implantation process, and then performing a high temperature annealing to form silicon dioxide ($SiO_2$). A thin silicon film layer remains on top of insulating layer 202, which is used to form the regions of embodiment SCR devices and other circuits. Alternatively, insulating later 202 may be formed by bonding to oxided wafers with the oxide layer face-to-face, and grinding the silicon of one wafer to thin film thickness, or may be formed using the Smart Cut process provided by SOITEC. Other methods of forming an insulating substrate may also be used to form embodiments disclosed herein.

STI regions 204 are formed by etching the silicon film layer until the top surface of insulating layer 202 is reached, and then filling in the resulting trenches with an insulator, such as $SiO_2$, and then planarizing the top surface. In various embodiments, the lower doped p-doped region 214 and the lower doped n-doped region 216 are formed by respectively implanting p-type and n-type carriers in the silicon film. Highly doped regions, such as p-doped tap region 206, n-type cathode region 208, p-type anode region 210 and n-doped tap region 212 may be formed, for example, by a boron (p-type), phosphorous or arsenic (n-type) ion implantation. In various embodiments p-doped tap region 206 and p-type anode regions 210 have the same doping concentration, and n-doped tap region 212 and n-type cathode regions 208 have the same doping concentration. Generally, p-doped tap region 206 and p-type anode regions 210 have a higher doping concentration than p-doped region 214; and the n-doped tap region 212 and n-type cathode region 208 have a greater doping concentration than n-doped region 216. In some embodiments, p-doped tap region 206 and p-type anode regions 210 have a doping concentration between about $1e^{19}$ cm$^{-3}$ and $1e^{20}$ cm$^{-3}$; p-doped region 214 has a doping concentration between $1e1^6$ cm$^{-3}$ and $1e1^8$ cm$^{-3}$; n-doped tap region 212 and n-type cathode region 208 have a doping concentration between about $1e^{19}$ cm$^{-3}$ and $1e^{20}$ cm$^{-3}$; and n-doped region 216 has a doping concentration between $1e^{16}$ cm$^{-3}$ and $1e^{18}$ cm$^{-3}$. It should be appreciated that values outside of these ranges may also be possible depending on the particular embodiments and its associated fabrication technology. It should also be appreciated that embodiments may be adapted for implementation in other types of SOI fabrication technology such as wafer bonding or Smart Cut as mentioned above.

A schematic representation of SCR device 200 is superimposed on FIG. 2B. As shown, p-type anode region 210, n-doped region 216 and p-doped region 214 respectively form the emitter, base and collector of pnp transistor 220; and n-type cathode region 208, p-doped region 214 and n-doped region 216 respectively form the emitter, base and collector of npn transistor 218. The parasitic resistance of p-doped region is represented by resistor 224, and the parasitic resistance of n-doped region 216 is represented by resistor 226. A schematic representation of these components of SCR 200 is also illustrated in FIG. 2D.

Figure 2C:
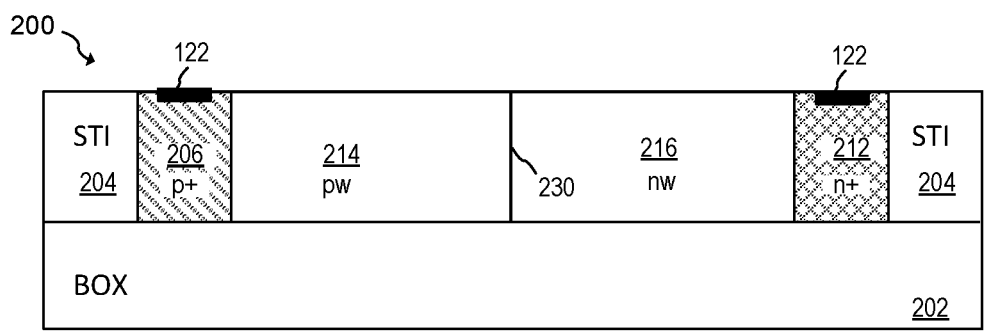

FIG. 2C illustrates a cross-section of the SCR device of FIG. 2A taken at line "B," which shows p-doped tap region 206, p-doped region 214, n-doped region 216 and n-doped tap region 212 disposed over insulating layer 202 and between STI regions 204.

Figure 2D:
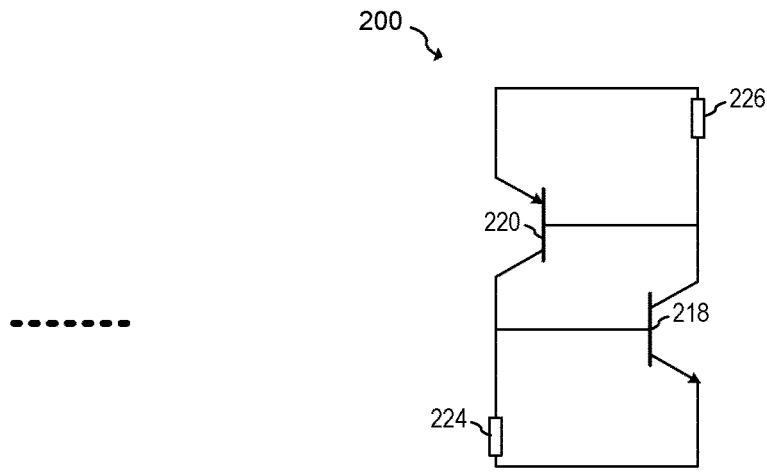
FIG. 2D illustrates a schematic representation of an embodiment SCR device.
Figure 2E:
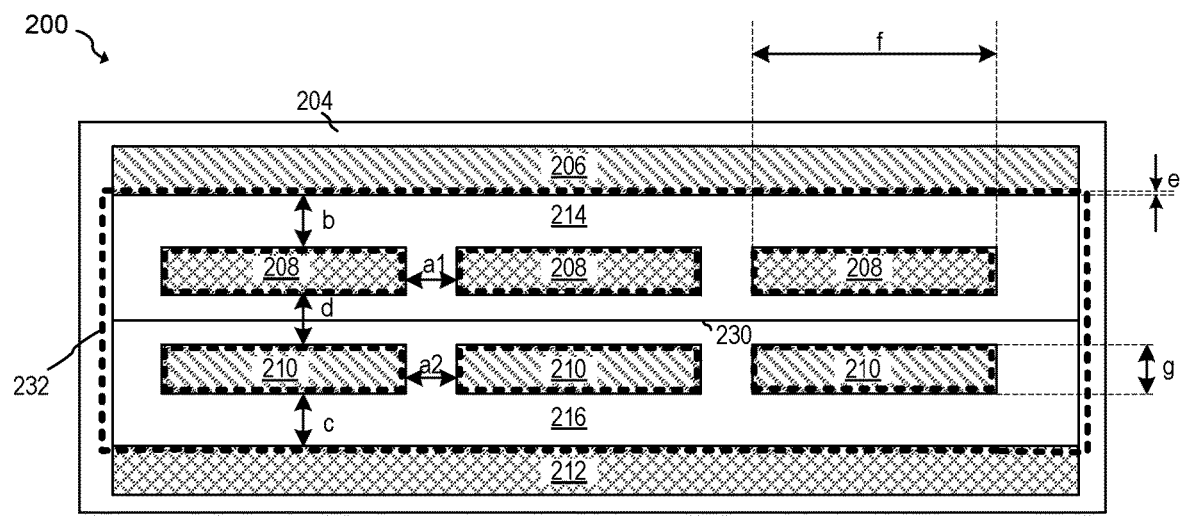
FIG. 2E illustrates a further plan view of an embodiment SCR device.

FIG. 2E provides a more detailed plan view of the active area of the embodiment SCR device illustrated in FIG. 2A. As shown, n-type cathode regions 208 are spaced apart from each other at a distance a1; p-type anode regions 210 are spaced apart from each other at a distance a2; p-doped tap region 206 is spaced apart from n-type cathode regions 208 at a distance b, n-doped tap region 212 is spaced apart from p-type anode regions 210 at a distance c; and n-type cathode regions 208 are spaced apart from the p-type anode regions 210 at a distance d. In some embodiments, regions 232 disposed over portions of p-doped region 214 and n-doped region 216 represent salicide blocked regions, which overlap respective portions of p-doped tap region 206, n-type cathode regions 208, n-type cathode regions 210 and n-doped tap region 212 at a distance of e. The width of n-type cathode regions 208 and p-type anode regions 210 is f, and the length of n-type cathode regions 208 and p-type anode regions 210 is g. While FIG. 2E shows portions of p-doped regions 214 between n-type cathode regions 208 and portions of n-doped regions 216 between p-type anode regions 210 as being salicide blocked regions (e.g., regions spaced apart by a1 and s2), it should be understood that salicide blocking on these areas are optional. In other words, in some embodiments, the portions of p-doped regions 214 between n-type cathode regions 208 and the portions of n-doped regions 216 between p-type anode regions 210 may have silicide.

In various embodiments, the spacing of various regions shown in FIG. 2D depends on the particular application, and the particular semiconductor process being used. For example, in transient triggered SCR (TT-SCR) applications the spacing between the various regions (a1, a2, b, c and d) may be set to be very small values, such as a minimum geometry or a minimum design rule spacing provided by the particular semiconductor process. For example, in a 240 nm process, spacing values a1, a2, b, c and d may be 240 nm. It should be understood, however, that some semiconductor processes may have different minimum geometries and/or different design rules governing spacing that depend on the respective layer(s) in which the spacing is contained. Thus, in some embodiments, some or all of process spacing values a1, a2, b, c and d may be different from each other. Generally, keeping these dimensions small advantageously allows for an embodiment SCR to be implemented in a small area while ensuring a low base resistance from each tap region to its respective p-type doped region or n-type doped region. In such embodiments, the width f and length g of n-type cathode regions 208 and p-type anode regions 210 may be made larger, for example, f=5 µm and g<=1 µm. In some embodiments, the segments of the segmented n-type cathode regions 208 and/or the segments of the segmented p-type anode 210 regions may not all have the same width f and/or length g. Typical overlap value e is process dependent. For example, in a typical 240 nm process, overlap value e may be, for example between about 0.1 µm and about 0.4 µm, however, values outside of this range are also possible.

In some TT-SCR applications, the spacing a1 between n-type cathode regions 208 may be different from the spacing a2 between p-type anode regions 210. For example, when the SCR is configured to be triggered from p-doped region 214, spacing a1 between n-type cathode regions 208 may be made larger than spacing a2 between p-type anode regions in order to make the value of parasitic resistance 224 associated with p-doped region 214 larger than the value of parasitic resistance 226 associated with n-doped region 216. The resulting reduction in the base resistance of pnp transistor 220 and the higher value of parasitic resistance 224 of the p-doped region 214 allows for easier triggering of SCR 200.

For other SCR applications, such protecting a power supply node, a I/O pin or for use as a voltage clamp, spacings a1, a2, b, c and d may be increased to non-minimum values in order to ensure good reverse diode capability for negative polarity ESD with respect to the diode junction formed at interface 230 between p-doped region 214 and n-doped region 216. In such embodiments, spacings a1, a2, b, c and d may be between about 1 m and 3 m for a 240 nm process.

It should be appreciated that the geometric values provided herein for embodiment SCR devices is just small set of sample values directed to particular implementation. Actual values used for embodiment implementation may vary according to the semiconductor process used, and the electrical requirements of a particular application.

Figure 3:
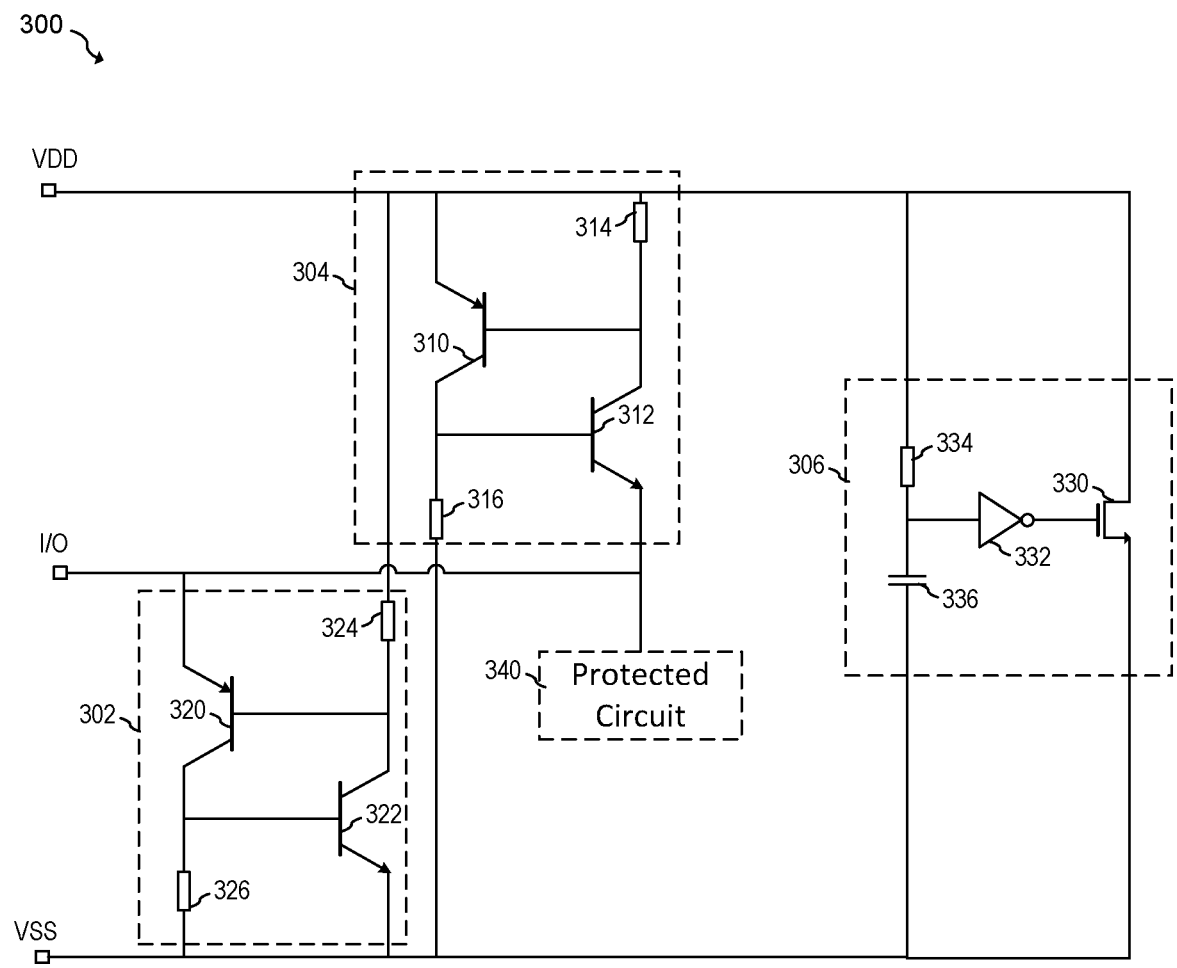
FIG. 3 illustrates a schematic of a TT-SCR ESD protection circuit according to an embodiment.

FIG. 3 illustrates a TT-SCR ESD protection circuit 300 according to an embodiment of the present invention. As shown, TT-SCR ESD protection circuit 300 includes a first SCR 302 coupled between input/output (I/O) terminal I/O, and power supply terminal VSS, a second SCR 304 coupled between power supply terminal VDD and terminal I/O, and a trigger circuit 306 (also referred to as a "trigger device") coupled between power supply terminal VDD and power supply terminal VSS. Each of SCR 302 and 304 are constructed and implemented as discussed above with respect to FIGS. 2A-2D. As illustrated, SCR 302 is represented as having pnp transistor 320, npn transistor 322 and resistors 324 and 326; and SCR 304 is represented as having pnp transistor 310, npn transistor 312 and resistors 314 and 316. Trigger circuit 306 includes an inverter 332, a transistor 330, and an RC circuit formed by resistor 334 and capacitor 336. The I/O terminal may also be coupled to a protected circuit 340, which could be any type of circuit having an interface node coupling to the I/O terminal.

When a positive transient signal is applied between terminal I/O and power supply terminal VSS (assuming that the circuit is disconnected from a power supply), the base-emitter junction of pnp transistor 320 of SCR 302 becomes forward biased and a current flows through the base-emitter junction of pnp transistor 320, through resistor 324 towards power supply node VDD. This current increases the voltage potential of power supply node VSS, which turns on transistor 330 via inverter 332, and starts charging capacitor 336. As long as the voltage across capacitor 336 is less than the threshold of inverter 332, transistor 330 remains on and is capable of sinking current supplied to it via the base-emitter junction of pnp transistor 320. After a short period of time, the current supplied to the base-emitter junction of pnp transistor 320 triggers SCR 302, thereby allowing ESD current to also be shunted to terminal VSS from the emitter to the collector of pnp transistor 320.

TT-SCR ESD protection circuit 300 operates in a similar manner for a negative going current pulse between terminal I/O and power supply terminal VDD. In this case, the ESD current flows through the base-emitter junction of npn 312 of SCR 304 toward node VSS and through transistor 330, which eventually triggers SCR 304. Once SCR 304 is triggered, ESD current is also shunted to power supply terminal VDD via pnp transistor 310.

It should be appreciated that the construction of embodiment SOI-based SCRs, namely the low impedance path between tap-regions, the diode junction of the doped regions and the respective anode or cathode regions advantageously allows for very fast triggering for TT-SCR applications.

Figure 4A:
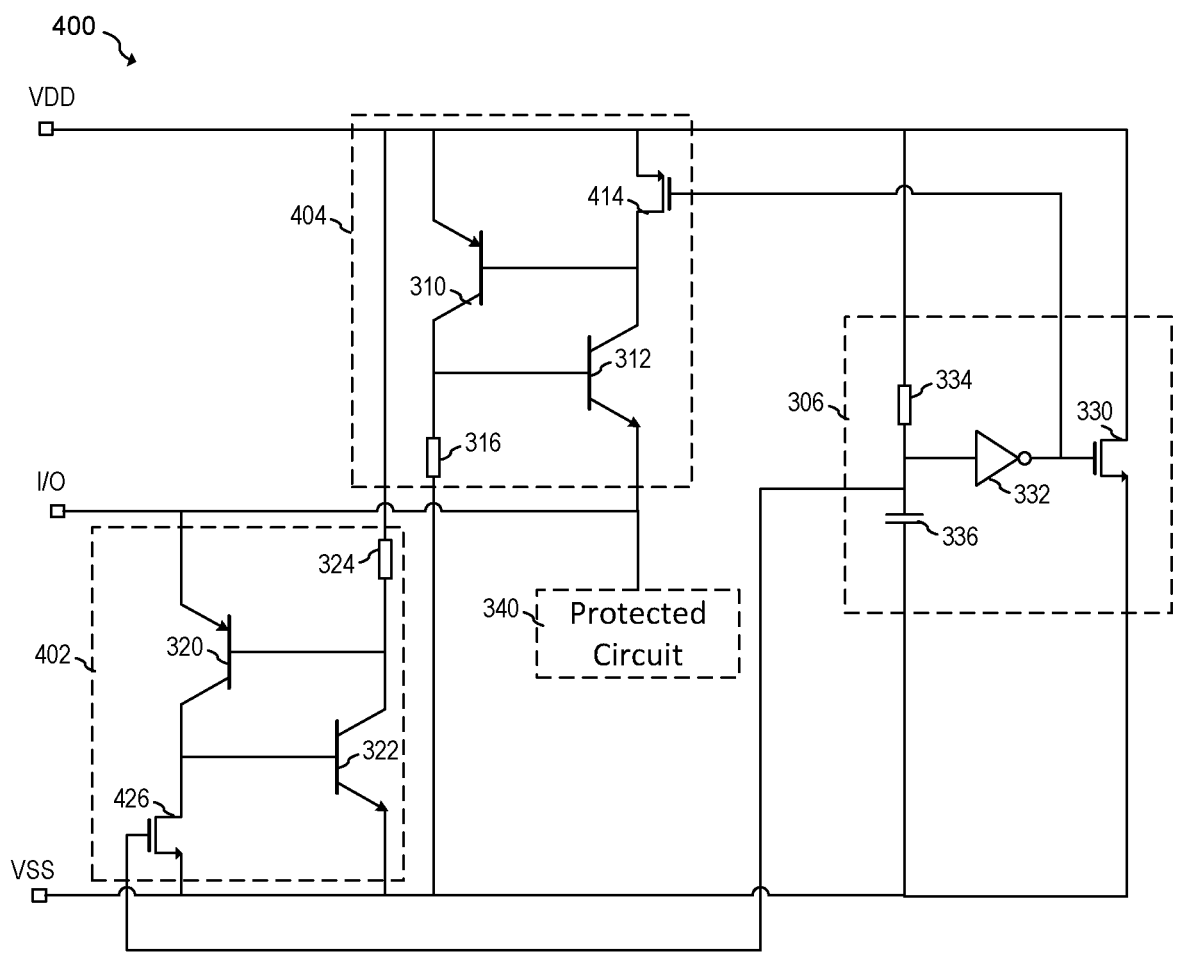
FIGS. 4A and 4B illustrate schematics of TT-SCR ESD protection circuits according to further embodiments.

FIG. 4A illustrates TT-SCR ESD protection circuit 400 in accordance with another embodiment of the present invention. TT-SCR ESD protection circuit 400 is similar to TT-SCR ESD protection circuit 300 of FIG. 3 with the addition of a series transistor coupled to each SCR. For example, SCR 402 coupled between terminal I/O and power supply terminal VSS has an NMOS transistor 426 coupled between the base of npn transistor 322 and power supply terminal VSS, and SCR 404 coupled between power supply terminal VDD and terminal I/O has a PMOS transistor coupled between the base of pnp transistor 310 and power supply terminal VDD. The gate of NMOS transistor 426 is coupled to the RC circuit formed by resistor 334 and capacitor 336 within trigger circuit 306, and the gate of PMOS transistor 414 is coupled to the output of inverter 330.

Operation of TI-SCR 400 is similar to the operation of TT-SCR 300, except that trigger circuit 306 keeps NMOS transistor 426 and PMOS transistor 414 off during triggering. For example, during triggering for times less than the RC time constant of resistor 334 and capacitor 336, the voltage applied to the gate of NMOS transistor 426 is close to the voltage potential of power supply terminal VSS, and the voltage applied to the gate of PMOS transistor 414 is close to the voltage potential of power supply terminal VDD, which effectively turns off these transistors. After the RC circuit formed by resistor 334 and 336 has settled, transistors 414, 426, as well as transistor 330, are turned on. Turning on transistors 414 and 426 after triggering and during normal operation ties the p-type trigger node of SCR 402 firmly to the voltage potential of terminal VSS, and ties the n-type trigger node of SCR 404 firmly to the voltage potential of terminal VSS. This advantageously assists in avoiding the accidental triggering of SCRs 402 and 404 by current injection via terminal I/O.

Figure 4B:
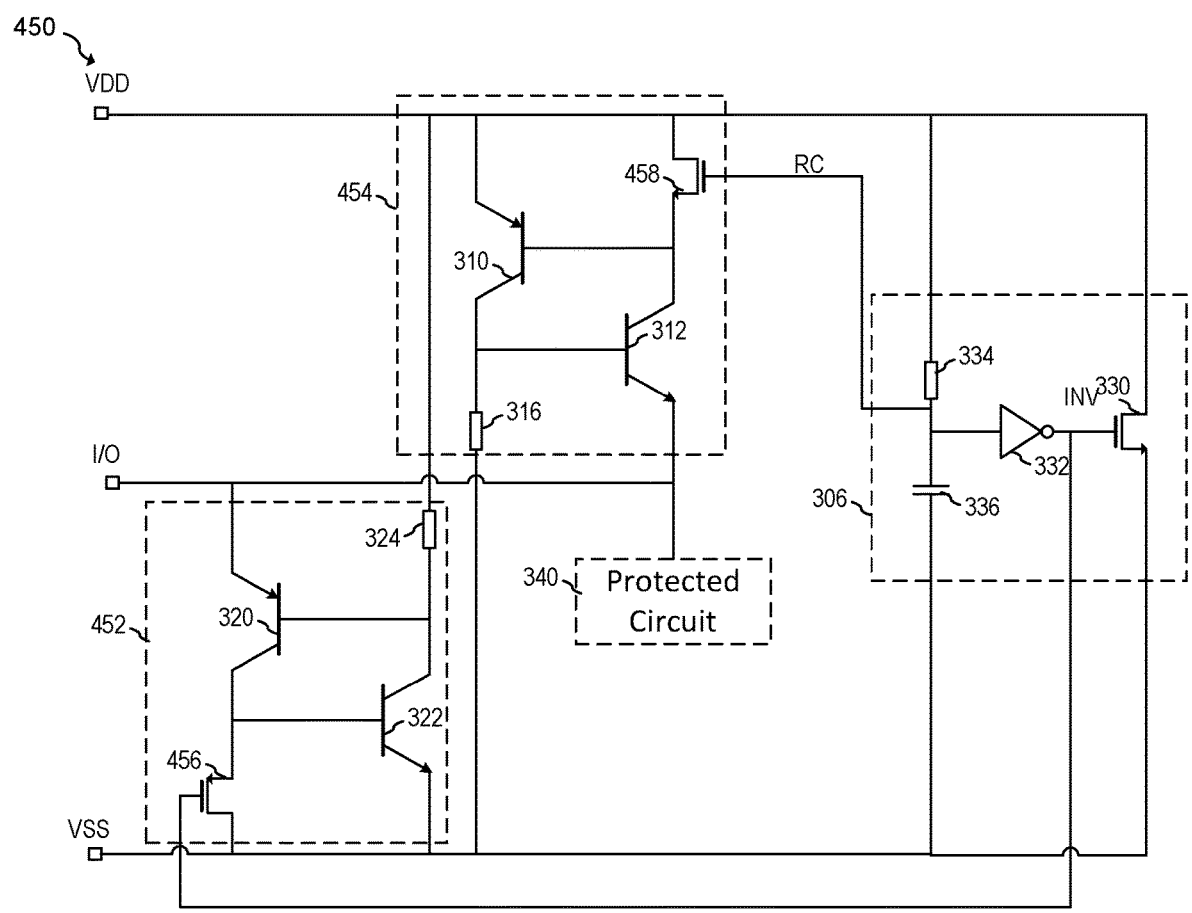

FIG. 4B illustrates TT-SCR ESD protection circuit 450 in accordance with another embodiment of the present invention. TT-SCR ESD protection circuit 400 is similar to TT-SCR ESD protection circuit 400 of FIG. 4A with the exception that the series transistor in SCR 452 coupled between terminal I/O and power supply terminal VSS is a PMOS transistor 456 instead of an NMOS transistor, and the series transistors in SCR 454 coupled between power supply node VSS and terminal I/O is an NMOS transistor 458 instead of a PMOS transistor. As shown, the gate of NMOS transistor 458 is coupled to the RC circuit formed by resistor 334 and capacitor 336 in trigger circuit 306, and the gate of PMOS transistor 456 is coupled to the output of inverter 332. The operation of TT-SCR ESD protection circuit 450 is similar to the operation of TT-SCR ESD protection circuit 400 depicted in FIG. 4A. For example, transistor 456 and 458 are off when SCR 402 and 404 are being triggered (e.g. when the device is disconnected from a power source), but are otherwise on during normal operation to prevent accidental triggering.

The TT-SCR ESD protection circuit 450 embodiment of FIG. 4B is advantageous in that SCRs 454 and 452 can be laid out in an area efficient manner as illustrated in FIGS. 2A, 2E, and 4C to 4F.

Figure 4C:
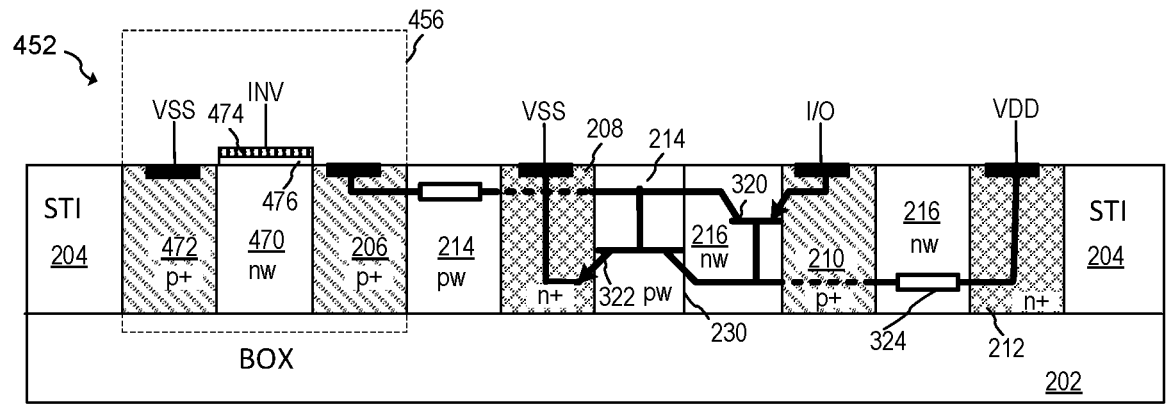
FIG. 4C illustrates a cross-section of an embodiment SCR device.

FIG. 4C illustrates a cross-sectional view of SCR 452 implemented in TT-SCR ESD protection circuit 450 shown in FIG. 4B. Nodes INV (output of inverter 332), VSS, I/O and VDD are labeled and the schematic representation of SCR device 452 including pnp transistor 320, npn transistor 322 and associated parasitic resistances are superimposed on the diagram for reference. The structure of SCR 452 is similar to the structure of SCR 200 described above with respect to FIGS. 2A-2D with the addition of a PMOS transistor 456 having a source/drain region that is shared with p-doped tap region 206. As shown, p-doped tap region 206 forms one source/drain region, and p-type regions 472 forms another source drain region of PMOS transistor 456. A lightly doped n-doped body region 470 forms a channel region (e.g., a p-channel or inversion channel during operation), gate dielectric region 476 forms the gate, and gate electrode 474 forms the gate electrode of PMOS transistor 456. By sharing a source/drain region with p-doped tap region 206, PMOS transistor 456 may be integrated within SCR 452 in a compact manner. In some embodiments, gate dielectric region 476 could be formed, for example, by a gate oxide layer. Alternatively, gate dielectric region 476 could be formed as $SiO_2/Si_3N_4$ stack or a high-k dielectric.

Figure 4D:
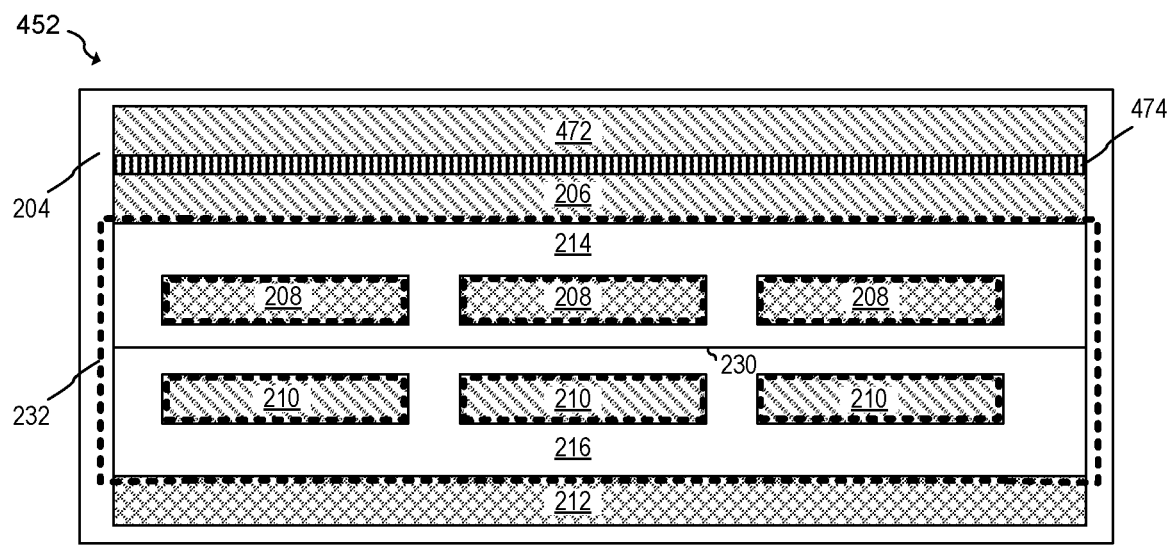
FIG. 4D illustrates a plan view of an embodiment SCR device.

FIG. 4D illustrates a plan view of the layout of SCR 452 that corresponds to the cross-sectional view illustrated in FIG. 4C. As shown, the layout of SCR 452 is similar to the layout of SCR 200 shown in FIG. 2E above, with the addition of PMOS transistor 456 formed by lightly doped n-doped body region 470, p-type source-drain region 472, gate electrode 474, and gate dielectric region (not shown) formed beneath gate electrode 474.

Figure 4E:
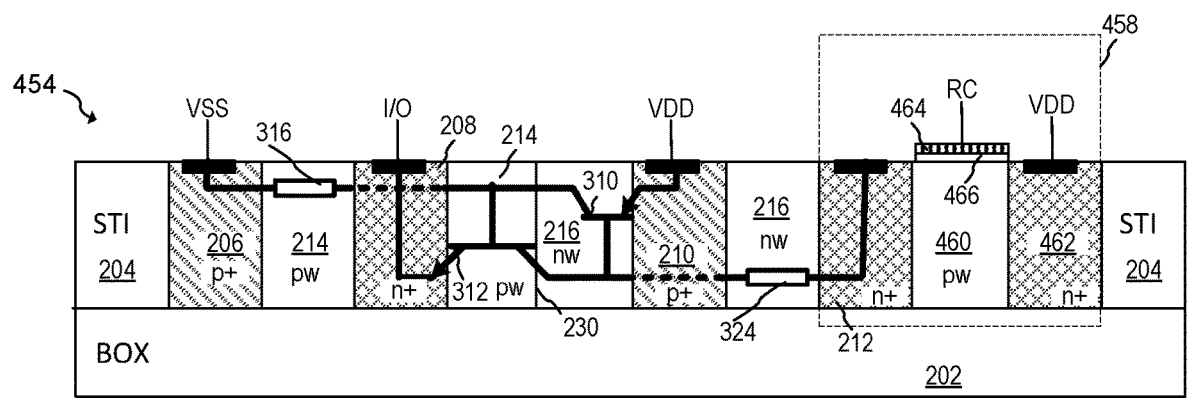
FIG. 4E illustrates a cross-section of an embodiment SCR device.

FIG. 4E illustrates a cross-sectional view of SCR 454 implemented in TT-SCR ESD protection circuit 450 shown in FIG. 4B. Nodes RC (output of RC circuit) VSS, I/O and VDD are labeled and the schematic representation of SCR device 454 including pnp 310, npn 312 and associated parasitic resistances are superimposed on the diagram for reference. The structure of SCR 454 is similar to the structure of SCR 452 above, with the exception that NMOS transistor 458 is integrated with the SCR instead of PMOS transistor 456.

As shown, NMOS transistor 458 shares a source/drain region with n-doped tap region 212 of SCR 454. N-doped tap region 212 forms one source/drain region, and n-doped source-drain region 462 forms another source drain region of NMOS transistor 458. A lightly doped p-doped body region 460 forms a channel region (e.g., an n-channel or inversion channel during operation), and gate dielectric region 466 forms the gate, and gate electrode 464 forms the gate electrode of NMOS transistor 458. By sharing a source/drain region with n-doped tap region 212, NMOS transistor 458 may also be integrated within SCR 454 in a compact manner. In some embodiments, gate dielectric region 466 could be formed, for example, by a gate oxide layer. Alternatively, gate dielectric region 466 could be formed as $SiO_2/Si_3N_4$ stack or a high-k dielectric.

Figure 4F:
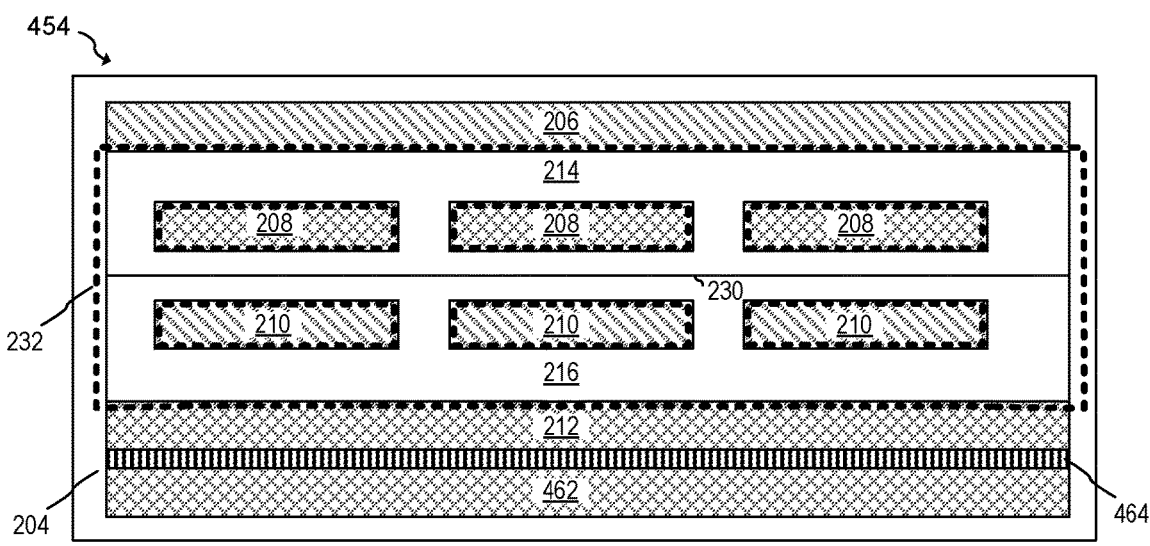
FIG. 4F illustrates a plan view of an embodiment SCR device.

FIG. 4F illustrates a plan view of the layout of SCR 452 that corresponds to the cross-sectional view illustrated in FIG. 4E. The layout of SCR 452 is similar to the layout of SCR 200 shown in FIG. 2E above, with the addition of NMOS transistor 458 formed by lightly doped p-doped body region 460, n-type source-drain region 462, gate electrode 464, and gate dielectric region 466 (not shown) formed beneath gate electrode 464.

Figure 5A:
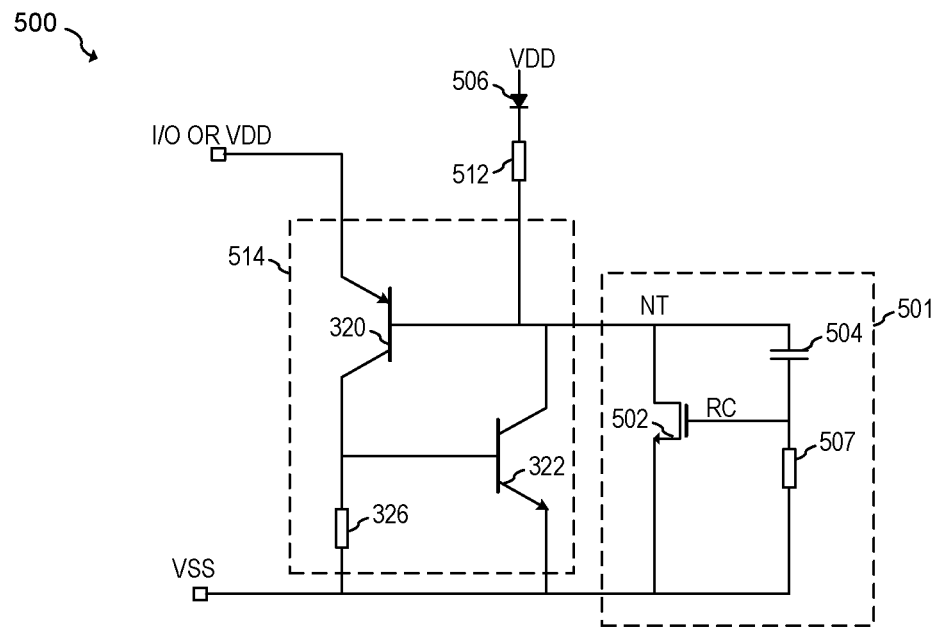
FIG. 5A illustrates a schematic of an ESD protection device.

In addition to being used to implement TT-SCR circuits, embodiment SCRs can also be used to implement I/O or power supply node protection as shown in FIG. 5A, which illustrates protection circuit 500. Protection circuit 500 includes SCR 514, and a trigger circuit 501 that includes NMOS transistor 502, diode 506, and a series RC circuit having capacitor 504 and resistor 507. Resistor 512 coupled between node NT and diode 506 is used to bias node NT during normal operation. Resistor may be implemented using an external resistor having a resistance, for example, in the kM range. As described above with respect to FIG. 3, SCR 514 can be schematically represented by pnp transistor 320, npn transistor 322, and parasitic resistor 326. In some embodiments, an additional resistance (not shown) may be coupled in parallel with parasitic resistors 326. Additional resistances may be disposed on the same integrated circuit as protection circuit 500 and may be implemented using resistor structures known in the art. In one example, this additional resistance may be implemented using a polysilicon resistor.

The anode of SCR 514 (e.g. the emitter of pnp transistor 320) may be coupled to either terminal I/O or to power supply terminal VDD. In embodiments in which the anode of SCR is coupled to terminal I/O to provide I/O protection, optional diode 506 may be coupled between trigger node NT and VDD, which allows terminal I/O to operate with voltages greater than the power supply voltage applied to terminal VDD. In embodiments in which the anode of SCR is coupled to power supply terminal VDD to provide VDD protection, diode 506 may be omitted, such that resistor 512 of SCR 514 is connected directly to terminal VDD.

During operation, when terminal I/O or VDD (depending on the configuration) encounters a positive going ESD pulse, the base-emitter junction of pnp transistor 320 becomes forward biased, thereby causing the voltage at trigger node NT to increase. This increased voltage is coupled to node RC via capacitor 504, which turns on npn transistor 502. When transistor 502 is turned on, the voltage at NT is pulled to ground, which turns on pnp transistor 320 and triggers (e.g. turns-on) SCR 514. Once SCR 514 is activated, ESD current is shunted to VSS via the SCR.

Figure 5B:
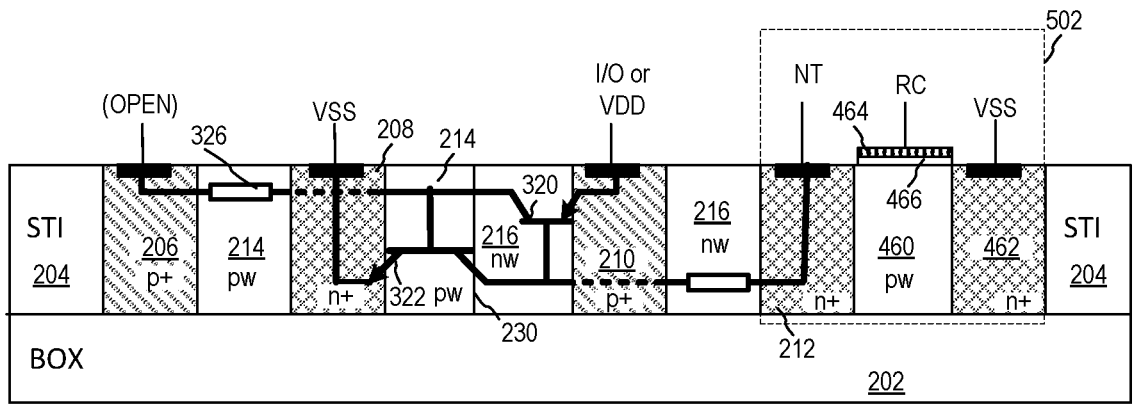
FIG. 5B illustrates a cross-sectional view of a portion of the ESD protection device of FIG. 5A.

FIG. 5B illustrates a cross-sectional view of SCR 514 and NMOS transistor 502 implemented in protection circuit 500 shown in FIG. 5A. Nodes VSS, I/O and VDD are labeled and the schematic representation of SCR device 514 including pnp transistor 320, npn transistor 322 and associated parasitic resistances is superimposed on the diagram for reference. The structure of SCR 514 is similar to the structure of SCR 200 described above with respect to FIGS. 2A-2D with the addition of a NMOS transistor 502 having a source/drain region that is shared with n-doped tap region 212. As shown, n-doped tap region 212 forms one source/drain region, and n-type source-drain region 462 forms another source drain region of NMOS transistor 502. A lightly doped p-doped body region 460 forms the channel region, gate dielectric region 466 forms the gate, and gate electrode 464 forms the gate electrode of NMOS transistor 502. By sharing a source/drain region with n-doped tap region 212, NMOS transistor 502 may be integrated within protection circuit 500 in a compact manner.

As shown, n-type cathode regions 208 are coupled to power supply terminal VSS, p-type anode regions 210 are coupled to terminal I/O or to power supply terminal VDD, n-doped tap region 212 is coupled to trigger node NT, gate electrode 464 is coupled to node RC, and p-doped tap region 206 is left open or disconnected.

In various embodiments, SCR 514 and NMOS transistor 502 may be laid out in a similar manner as the plan view of SCR 454 shown in FIG. 4F described above.

Figure 5C:
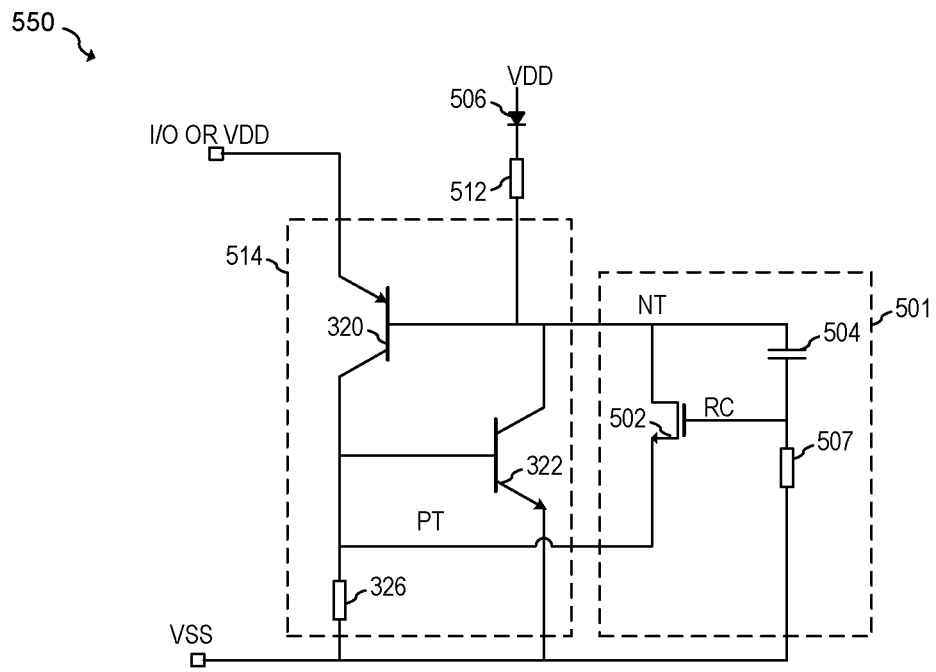
FIG. 5C illustrates a schematic of an ESD protection device.

FIG. 5C illustrates ESD protection circuit 550 according to a further embodiment. Protection circuit 550 is similar to protection circuit 500 shown in FIG. 5A with the exception that the source of transistor 502 is coupled to the base of npn transistor 322 and the collector of pnp transistor 320 of SCR 514 instead of to terminal VSS. By coupling the source of transistor 502 in this manner, the p-type trigger node of SCR 514 can be triggered by trigger circuit 501 in addition to the p-type trigger node of SCR 514.

Figure 5D:
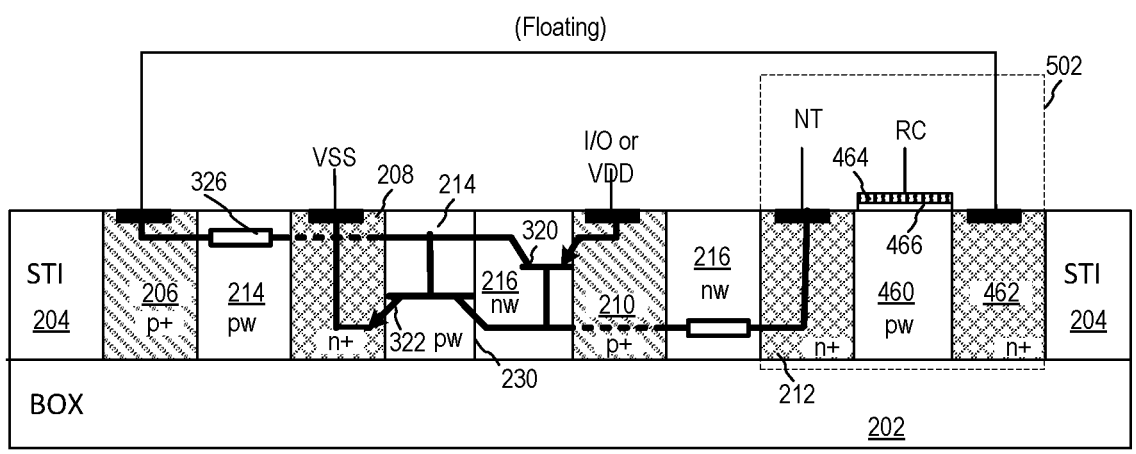
FIG. 5D illustrates a cross-sectional view of a portion of the ESD protection device of FIG. 5C.

FIG. 5D illustrates a cross-sectional view of SCR 514 and NMOS transistor 502 implemented in protection circuit 550 shown in FIG. 5C. The structure of SCR 514 and NMOS transistor 502 is similar to the structure shown in FIG. 5B with the exception that p-doped tap region 206 is coupled to n-type region 462 and is left floating instead of coupling n-type region 462 to VSS.

Figure 5E:
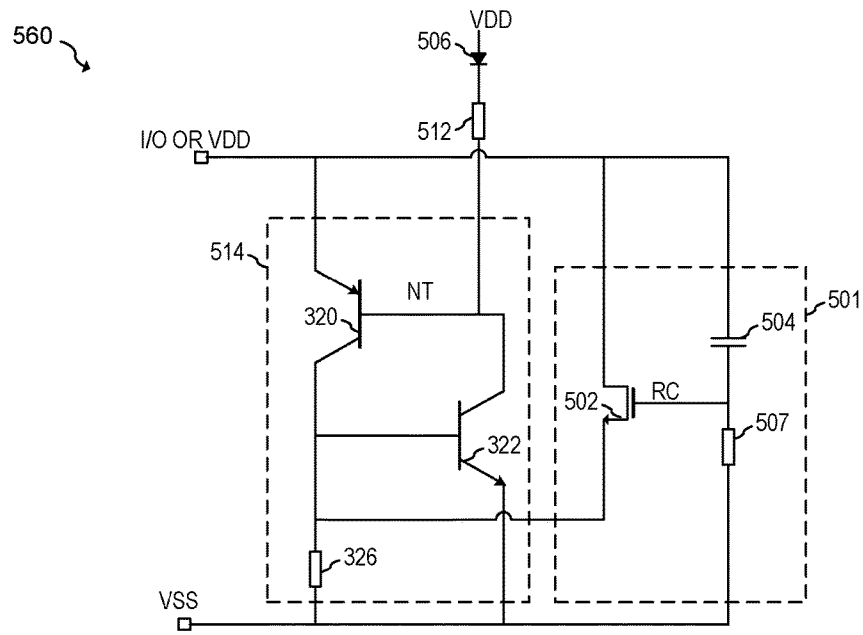
FIG. 5E illustrates a schematic of an ESD protection device.

FIG. 5E illustrates ESD protection circuit 560 according to a further embodiment. Protection circuit 550 is similar to protection circuit 550 shown in FIG. 5C with the exception that the drain of NMOS transistor 502 is coupled to the node to be protected (VDD) instead of to n-type trigger node NT. In this configuration trigger node PT is pulled high by NMOS transistor 502 in response to a positive transient on the node to be protected (e.g., node I/O or VDD).

Figure 5F:
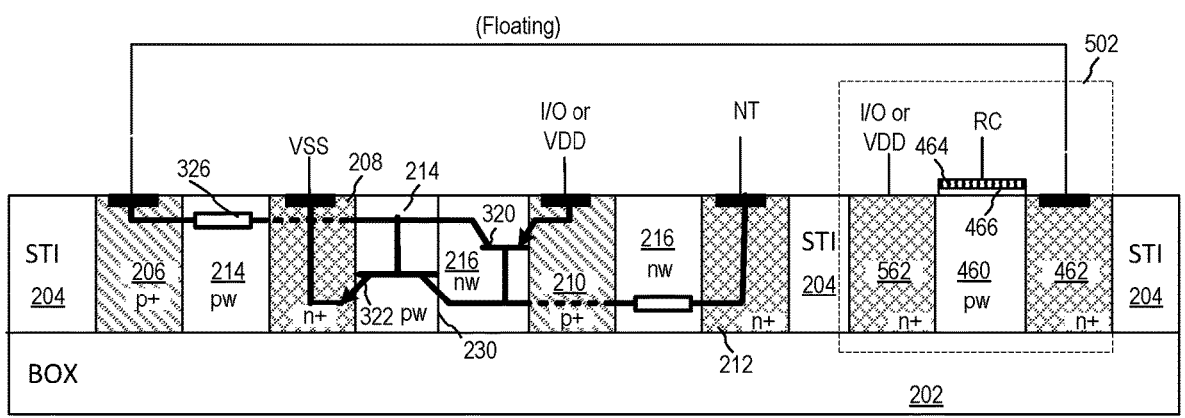
FIG. 5F illustrates a cross-sectional view of a portion of the ESD protection device of FIG. 5E.

FIG. 5F illustrates a cross-sectional view of SCR 514 and NMOS transistor 502 implemented in protection circuit 560 shown in FIG. 5E. The structure of SCR 514 and NMOS transistor 502 is similar to the structure shown in FIG. 5D with the exception that NMOS transistor 502 does not share a source-drain region with SCR 514. Rather, NMOS transistor 502 includes its own n-type source-drain regions 462 and 562 and lightly doped p-doped body region 460 forming the channel region. As shown, an n-type source-drain region 562 corresponding to the drain of NMOS transistor 502 is coupled to either the I/O or the VDD terminal depending on which terminal is designated for protection.

Figure 5G:
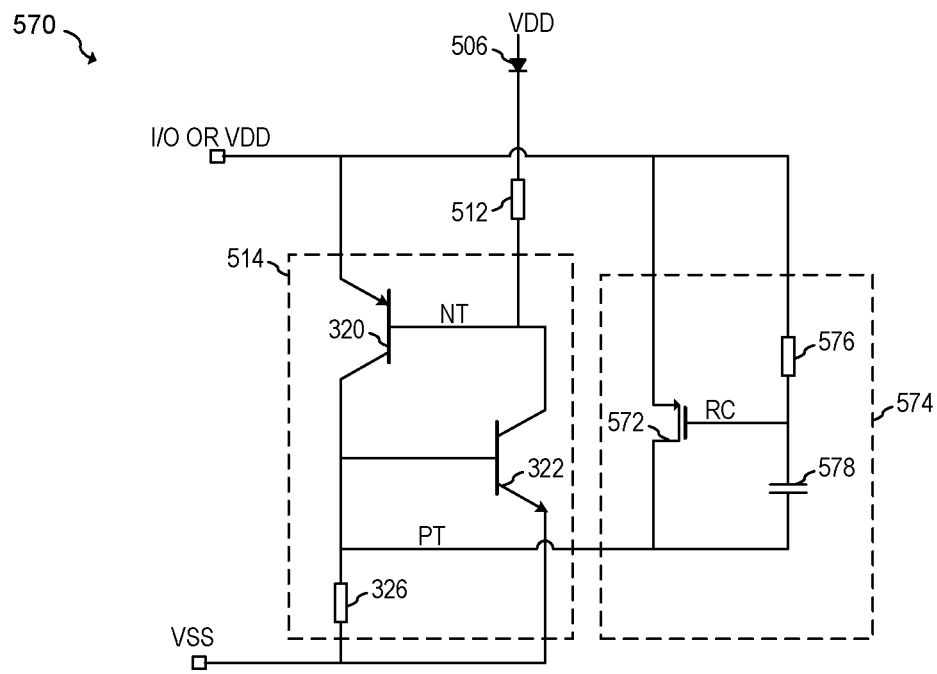
FIG. 5G illustrates a schematic of an ESD protection device.

FIG. 5G illustrates ESD protection circuit 570 according to a further embodiment. Protection circuit 570 is similar to protection circuit 560 shown in FIG. 5E with the exception that NMOS transistor 502 is replaced by PMOS transistor 572, and trigger circuit 501 is replaced by trigger circuit 574 that includes a resistor 576 coupled between terminal I/O or power supply terminal VDD and node RC at the gate of transistor 572, and a capacitor 578 coupled between node RC and p-type trigger node PT.

Figure 5H:
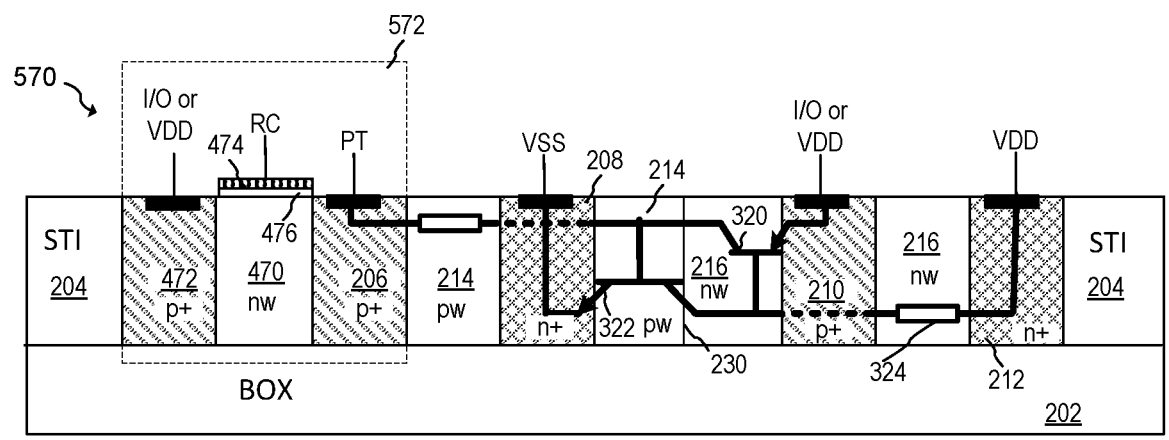
FIG. 5H illustrates a cross-sectional view of a portion of the ESD protection device of FIG. 5G.

FIG. 5H illustrates a cross-sectional view of SCR 514 and PMOS transistor 572 implemented in protection circuit 570 shown in FIG. 5G. The structure of SCR 514 and PMOS transistor 502 is similar to the cross-sectional view shown in FIG. 4C discussed above. As shown, n-type cathode regions 208 are coupled to power supply terminal VSS, p-type anode regions 210 are coupled to terminal I/O or to power supply terminal VDD, n-doped tap region 212 is coupled to power supply terminal VDD (in some embodiments via diode 506), gate electrode 474 is coupled to node RC, p-type source-drain region 472 is coupled to power supply node VDD or to terminal I/O, and p-doped tap region 206 is coupled, for example, to capacitor 578. In various embodiments, SCR 514 and PMOS transistor 572 may be laid out in a similar manner as the plan view of SCR 452 and PMOS transistor 456 shown in FIG. 4C described above.

Figure 6:
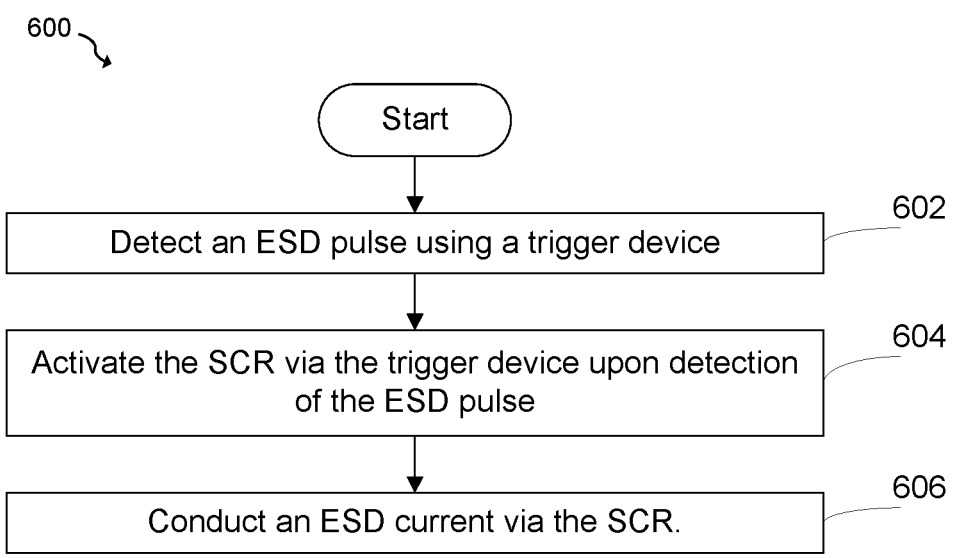
FIG. 6 illustrates a flowchart of a method according to an embodiment.

FIG. 6 illustrates a block diagram of a method 600 of operating an SCR ESD device according to embodiments described herein. For example, method 600 may be used to provide protection to a circuit using a silicon controlled rectifier (SCR) that includes an n-doped region disposed over an insulating layer and coupled to a first trigger node via an n-doped tap region disposed adjacent to the n-doped region, a p-doped region disposed over the insulating layer adjacent to the n-doped region and coupled to a second trigger node via a p-doped tap region adjacent to the p-doped region, wherein the n-doped region and p-doped region form a first diode, segmented p-type anode regions disposed over the insulating layer and connected to an anode node, each of the segmented p-type anode regions being surrounded by the n-doped region, and segmented n-type cathode regions disposed over the insulating layer and connected to a cathode node, where each of the segmented n-type cathode regions are surrounded by the p-doped region.

In step 602, an ESD pulse is detected using a trigger device. This trigger device be a circuit such as trigger circuit 306 described above with respect to FIGS. 3, 4A, 4B; trigger circuit 501 described above with respect to FIGS. 5A, 5C, and 5E; trigger circuit 574 described above with respect to FIG. 5G; or other suitable trigger circuits or devices. In step 604, the SCR is activated upon detection of the ESD pulse; and in step 606, ESD current is conducted through the triggered SCR device.

Embodiments of the present invention are summarized here. Other embodiments can also be understood from the entirety of the specification and the claims filed herein.

Example 1. A semiconductor device including: an n-doped region disposed over an insulating layer; a p-doped region disposed over the insulating layer adjacent to the n-doped region, where an interface between the n-doped region and the p-doped region form a first diode junction; a plurality of segmented p-type anode regions disposed over the insulating layer, each of the plurality of segmented p-type anode regions being surrounded by the n-doped region, where a doping concentration of the plurality of segmented p-type anode regions is greater than a doping concentration of the p-doped region; and a plurality of segmented n-type cathode regions disposed over the insulating layer. Each of the plurality of segmented n-type cathode regions are surrounded by the p-doped region, where a doping concentration of the plurality of segmented n-type cathode regions is greater than a doping concentration of the n-doped region.

Example 2. The semiconductor device of example 1, further including: an n-doped tap region disposed over the insulating layer and in physical contact with the n-doped region, where a doping concentration of the n-doped tap region is greater than the doping concentration of the n-doped region; and an p-doped tap region disposed over the insulating layer and in physical contact with the p-doped region, where a doping concentration of the p-doped tap region is greater than the doping concentration of the p-doped region.

Example 3. The semiconductor device of example 2, further including: a n-doped body region disposed adjacent to the p-doped tap region opposite the n-doped region; a p-type source-drain region disposed adjacent to the n-doped body region; a gate dielectric region disposed over the n-doped body region; and a gate electrode disposed over the gate dielectric region, where the p-doped tap region, n-doped body region, p-type source-drain region, gate dielectric region and gate electrode form a PMOS transistor.

Example 4. The semiconductor device of example 2, further including: a p-doped body region disposed adjacent to the n-doped tap region opposite the p-doped region; an n-type source-drain region disposed adjacent to the p-doped body region; a gate dielectric region disposed over the p-doped body region; and a gate electrode disposed over the gate dielectric region, where the n-doped tap region, p-doped body region, n-type source-drain region, gate dielectric region and gate electrode form an NMOS transistor.

Example 5. The semiconductor device of example 2, where: the plurality of segmented p-type anode regions is arranged in a first line parallel to the interface between the n-doped region and the p-doped region; the plurality of segmented n-type cathode regions is arranged in a second line parallel to the interface between the n-doped region and the p-doped region; and the first line is parallel to the second line.

Example 6. The semiconductor device of one of examples 1 to 5, where: a spacing between a first p-type anode region of the plurality of segmented p-type anode regions and a second p-type anode region of the plurality of segmented p-type anode regions includes a first minimum design rule spacing; and a spacing between a first n-type cathode region of the plurality of segmented n-type cathode regions and a second n-type cathode region of the plurality of segmented n-type cathode regions includes a second minimum design rule spacing.

Example 7. The semiconductor device of one of examples 1 to 6, where: a spacing between a first p-type anode region of the plurality of segmented p-type anode regions and a first n-type cathode region of the plurality of segmented n-type cathode regions includes a third minimum design rule spacing.

Example 8. The semiconductor device of one of examples 1 to 7, where each of the n-doped region and the p-doped region includes respective salicide blocked regions.

Example 9. An ESD protection circuit including: at least one silicon controlled rectifier (SCR) device including: an n-well region disposed over an insulating layer and coupled to a first trigger node via an n-doped tap region disposed adjacent to the n-well region, a p-well region disposed over the insulating layer adjacent to the n-well region and coupled to a second trigger node via a p-doped tap region adjacent to the p-well region, where the n-well region and p-well region form a first diode, segmented p-type anode regions disposed over the insulating layer and connected to an anode node, each of the segmented p-type anode regions being surrounded by the n-well region, and segmented n-type cathode regions disposed over the insulating layer and connected to a cathode node, each of the segmented n-type cathode regions being surrounded by the p-well region; and a trigger device coupled to the at least one SCR.

Example 10. The ESD protection circuit of example 9, where: the at least one SCR device includes a first SCR device and a second SCR device; the anode node of the first SCR device is coupled to a first power supply node, the cathode node of the first SCR device is coupled to a signal node, and the p-doped tap region of the first SCR device is coupled to a second power supply node; the anode node of the second SCR device is coupled to the signal node, the cathode node of the second SCR device is coupled to the second power supply node, and the n-doped tap regions of the second SCR device is coupled to the first power supply node; and the trigger device is coupled between the first power supply node and the second power supply node.

Example 11. The ESD protection circuit of example 10, where the trigger device includes a triggered clamp.

Example 12. The ESD protection circuit of example 11, where the triggered clamp includes: an RC circuit coupled between the first power supply node and the second power supply node; and a transistor having a load path coupled between the first power supply node and the second power supply node, and a control node coupled to the RC circuit.

Example 13. The ESD protection circuit of one of examples 10 to 12, further including: a first transistor having a load path coupled between the first trigger node of the first SCR device and the first power supply node, and a control node coupled to the trigger device; and a second transistor having a load path coupled between the second trigger node of the second SCR device and the second power supply node, and a control node coupled to the triggering device.

Example 14. The ESD protection circuit of example 13, where the trigger device includes an RC circuit coupled between the first power supply node and the second power supply node.

Example 15. The ESD protection circuit of example 13, where: the first transistor includes an NMOS device having a first source-drain region formed by the n-doped tap region of the first SCR device and a second source-drain region disposed adjacent to the p-well region; and the second transistor includes a PMOS device having a first source-drain region formed by the p-doped tap region of the second SCR device and a second source-drain region disposed adjacent to the n-well region.

Example 16. The ESD protection circuit of one of examples 9 to 15, where: the at least one SCR device includes a first SCR device; and the anode node of the first SCR device is coupled to a protected node, and the cathode node of the first SCR device is coupled to a second power supply node.

Example 17. The ESD protection circuit of example 16, where the protected node includes a first power supply node or a signal node.

Example 18. The ESD protection circuit of example 16, where the trigger device includes: a trigger circuit; and a trigger transistor having a first load path terminal coupled to the first trigger node of the first SCR device, a second load path terminal coupled to the second power supply node or to the p-doped tap region of the first SCR device, and a control node coupled to the trigger circuit, where the trigger transistor includes an NMOS device having a first source-drain region formed by the n-doped tap region of the first SCR device and a second source-drain region disposed adjacent to the p-well region.

Example 19. The ESD protection circuit of example 16, where the trigger device includes: a trigger circuit; and a trigger transistor having a first load path terminal coupled to the second trigger node of the first SCR device, a second load path terminal coupled to the protected node, and a control node coupled to the trigger circuit, where the trigger transistor includes a PMOS device having a first source-drain region formed by the p-doped tap region of the first SCR device and a second source-drain region disposed adjacent to the n-well region.

Example 20. A method of ESD protection using a silicon controlled rectifier (SCR) including an n-doped region disposed over an insulating layer and coupled to a first trigger node via an n-doped tap region disposed adjacent to the n-doped region, a p-doped region disposed over the insulating layer adjacent to the n-doped region and coupled to a second trigger node via a p-doped tap region adjacent to the p-doped region, where the n-doped region and p-doped region form a first diode, segmented p-type anode regions disposed over the insulating layer and connected to an anode node, each of the segmented p-type anode regions being surrounded by the n-doped region, and segmented n-type cathode regions disposed over the insulating layer and connected to a cathode node, each of the segmented n-type cathode regions being surrounded by the p-doped region, the method including: detecting an ESD pulse using a trigger device; activating the SCR via the trigger device upon detection of the ESD pulse; and conducting an ESD current via the SCR.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor device comprising:
   an n-doped region disposed over an insulating layer;
   a p-doped region disposed over the insulating layer adjacent to the n-doped region, wherein an interface between the n-doped region and the p-doped region form a first diode junction;
   a plurality of segmented p-type anode regions disposed over the insulating layer, each of the plurality of segmented p-type anode regions being surrounded by the n-doped region, wherein a doping concentration of the plurality of segmented p-type anode regions is greater than a doping concentration of the p-doped region; and
   a plurality of segmented n-type cathode regions disposed over the insulating layer, each of the plurality of segmented n-type cathode regions being surrounded by the p-doped region, wherein a doping concentration of the plurality of segmented n-type cathode regions is greater than a doping concentration of the n-doped region.

2. The semiconductor device of claim 1, further comprising:
   an n-doped tap region disposed over the insulating layer and in physical contact with the n-doped region, wherein a doping concentration of the n-doped tap region is greater than the doping concentration of the n-doped region; and
   an p-doped tap region disposed over the insulating layer and in physical contact with the p-doped region, wherein a doping concentration of the p-doped tap region is greater than the doping concentration of the p-doped region.

3. The semiconductor device of claim 2, further comprising:
   a n-doped body region disposed adjacent to the p-doped tap region opposite the n-doped region;
   a p-type source-drain region disposed adjacent to the n-doped body region;
   a gate dielectric region disposed over the n-doped body region; and
   a gate electrode disposed over the gate dielectric region, wherein the p-doped tap region, n-doped body region, p-type source-drain region, gate dielectric region and gate electrode form a PMOS transistor.

4. The semiconductor device of claim 2, further comprising:
a p-doped body region disposed adjacent to the n-doped tap region opposite the p-doped region;
an n-type source-drain region disposed adjacent to the p-doped body region;
a gate dielectric region disposed over the p-doped body region; and
a gate electrode disposed over the gate dielectric region, wherein the n-doped tap region, p-doped body region, n-type source-drain region, gate dielectric region and gate electrode form an NMOS transistor.

5. The semiconductor device of claim 2, wherein:
the plurality of segmented p-type anode regions is arranged in a first line parallel to the interface between the n-doped region and the p-doped region;
the plurality of segmented n-type cathode regions is arranged in a second line parallel to the interface between the n-doped region and the p-doped region; and
the first line is parallel to the second line.

6. The semiconductor device of claim 1, wherein:
a spacing between a first p-type anode region of the plurality of segmented p-type anode regions and a second p-type anode region of the plurality of segmented p-type anode regions comprises a first minimum design rule spacing; and
a spacing between a first n-type cathode region of the plurality of segmented n-type cathode regions and a second n-type cathode region of the plurality of segmented n-type cathode regions comprises a second minimum design rule spacing.

7. The semiconductor device of claim 1, wherein:
a spacing between a first p-type anode region of the plurality of segmented p-type anode regions and a first n-type cathode region of the plurality of segmented n-type cathode regions comprises a third minimum design rule spacing.

8. The semiconductor device of claim 1, wherein each of the n-doped region and the p-doped region comprises respective salicide blocked regions.

9. An ESD protection circuit comprising:
at least one silicon controlled rectifier (SCR) device comprising:
an n-well region disposed over an insulating layer and coupled to a first trigger node via an n-doped tap region disposed adjacent to the n-well region,
a p-well region disposed over the insulating layer adjacent to the n-well region and coupled to a second trigger node via a p-doped tap region adjacent to the p-well region, wherein the n-well region and p-well region form a first diode,
segmented p-type anode regions disposed over the insulating layer and connected to an anode node, each of the segmented p-type anode regions being surrounded by the n-well region, and
segmented n-type cathode regions disposed over the insulating layer and connected to a cathode node, each of the segmented n-type cathode regions being surrounded by the p-well region; and
a trigger device coupled to the at least one SCR.

10. The ESD protection circuit of claim 9, wherein:
the at least one SCR device comprises a first SCR device and a second SCR device;
the anode node of the first SCR device is coupled to a first power supply node, the cathode node of the first SCR device is coupled to a signal node, and the p-doped tap region of the first SCR device is coupled to a second power supply node;
the anode node of the second SCR device is coupled to the signal node, the cathode node of the second SCR device is coupled to the second power supply node, and the n-doped tap regions of the second SCR device is coupled to the first power supply node; and
the trigger device is coupled between the first power supply node and the second power supply node.

11. The ESD protection circuit of claim 10, wherein the trigger device comprises a triggered clamp.

12. The ESD protection circuit of claim 11, wherein the triggered clamp comprises:
an RC circuit coupled between the first power supply node and the second power supply node; and
a transistor having a load path coupled between the first power supply node and the second power supply node, and a control node coupled to the RC circuit.

13. The ESD protection circuit of claim 10, further comprising:
a first transistor having a load path coupled between the first trigger node of the first SCR device and the first power supply node, and a control node coupled to the trigger device; and
a second transistor having a load path coupled between the second trigger node of the second SCR device and the second power supply node, and a control node coupled to the triggering device.

14. The ESD protection circuit of claim 13, wherein the trigger device comprises an RC circuit coupled between the first power supply node and the second power supply node.

15. The ESD protection circuit of claim 13, wherein:
the first transistor comprises an NMOS device having a first source-drain region formed by the n-doped tap region of the first SCR device and a second source-drain region disposed adjacent to the p-well region; and
the second transistor comprises a PMOS device having a first source-drain region formed by the p-doped tap region of the second SCR device and a second source-drain region disposed adjacent to the n-well region.

16. The ESD protection circuit of claim 9, wherein:
the at least one SCR device comprises a first SCR device; and
the anode node of the first SCR device is coupled to a protected node, and the cathode node of the first SCR device is coupled to a second power supply node.

17. The ESD protection circuit of claim 16, wherein the protected node comprises a first power supply node or a signal node.

18. The ESD protection circuit of claim 16, wherein the trigger device comprises:
a trigger circuit; and
a trigger transistor having a first load path terminal coupled to the first trigger node of the first SCR device, a second load path terminal coupled to the second power supply node or to the p-doped tap region of the first SCR device, and a control node coupled to the trigger circuit, wherein the trigger transistor comprises an NMOS device having a first source-drain region formed by the n-doped tap region of the first SCR device and a second source-drain region disposed adjacent to the p-well region.

19. The ESD protection circuit of claim 16, wherein the trigger device comprises:
   a trigger circuit; and
   a trigger transistor having a first load path terminal coupled to the second trigger node of the first SCR device, a second load path terminal coupled to the protected node, and a control node coupled to the trigger circuit, wherein the trigger transistor comprises a PMOS device having a first source-drain region formed by the p-doped tap region of the first SCR device and a second source-drain region disposed adjacent to the n-well region.

20. A method of ESD protection using a silicon controlled rectifier (SCR) comprising an n-doped region disposed over an insulating layer and coupled to a first trigger node via an n-doped tap region disposed adjacent to the n-doped region, a p-doped region disposed over the insulating layer adjacent to the n-doped region and coupled to a second trigger node via a p-doped tap region adjacent to the p-doped region, wherein the n-doped region and p-doped region form a first diode, segmented p-type anode regions disposed over the insulating layer and connected to an anode node, each of the segmented p-type anode regions being surrounded by the n-doped region, and segmented n-type cathode regions disposed over the insulating layer and connected to a cathode node, each of the segmented n-type cathode regions being surrounded by the p-doped region, the method comprising:
   detecting an ESD pulse using a trigger device;
   activating the SCR via the trigger device upon detection of the ESD pulse; and
   conducting an ESD current via the SCR.

\* \* \* \* \*